(12) United States Patent
Han et al.

(10) Patent No.: US 9,904,109 B2
(45) Date of Patent: Feb. 27, 2018

(54) COLOR FILTER, METHOD OF MAKING THE SAME, AND DISPLAY DEVICE INCLUDING THE SAME

(71) Applicant: SAMSUNG ELECTRONICS CO., LTD., Suwon-si, Gyeonggi-do (KR)

(72) Inventors: Yong Seok Han, Anyang-si (KR); Nayoun Won, Suwon-si (KR); Hyun A Kang, Suwon-si (KR); Ha Il Kwon, Incheon-si (KR); Shang Hyeun Park, Yongin-si (KR); Eun Joo Jang, Suwon-si (KR); Shin Ae Jun, Seongnam-si (KR); Deukseok Chung, Yongin-si (KR); Tae Won Jeong, Yongin-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 15/206,718

(22) Filed: Jul. 11, 2016

(65) Prior Publication Data
US 2017/0176816 A1    Jun. 22, 2017

(30) Foreign Application Priority Data
Dec. 16, 2015  (KR) .................. 10-2015-0180233

(51) Int. Cl.
*G02B 5/20*      (2006.01)
*G02F 1/1335*    (2006.01)
*G03F 7/00*      (2006.01)

(52) U.S. Cl.
CPC ....... *G02F 1/133617* (2013.01); *G02B 5/201* (2013.01); *G02F 1/133514* (2013.01); *G02F 1/133621* (2013.01); *G03F 7/0007* (2013.01); *G02F 2001/133614* (2013.01)

(58) Field of Classification Search
CPC ......... G03F 7/0007; G02B 5/20; G02B 5/201; G02F 1/133514; G02F 1/133516
USPC ............................................... 430/7; 359/106
See application file for complete search history.

(56) References Cited

U.S. PATENT DOCUMENTS

| | | | |
|---|---|---|---|
| 2002/0089615 A1* | 7/2002 | Sakamoto ......... | G02F 1/136227 349/43 |
| 2010/0317819 A1 | 12/2010 | De Keyzer et al. | |
| 2014/0132890 A1 | 5/2014 | Zhang | |
| 2014/0192294 A1* | 7/2014 | Chen ........................ | F21V 9/08 349/69 |
| 2014/0264196 A1 | 9/2014 | Werner et al. | |

(Continued)

FOREIGN PATENT DOCUMENTS

| | | |
|---|---|---|
| CN | 105116604 A  * | 12/2015 |
| KR | 101140309 B1 | 4/2012 |

(Continued)

*Primary Examiner* — John A McPherson
(74) *Attorney, Agent, or Firm* — Cantor Colburn LLP (57) ABSTRACT

A color filter including a first region configured to emit a first light, a second region configured to emit a second light having a longer wavelength than a wavelength of the first light, a third region configured to emit a third light having a longer wavelength than the wavelength of the second light, a first layer including two or more quantum dots, and a second layer formed on at least one surface of the first layer, wherein the first layer and the second layer are disposed in at least the second region and the third region.

16 Claims, 4 Drawing Sheets

(56) References Cited

U.S. PATENT DOCUMENTS

2015/0301408 A1* 10/2015 Li .................... G02F 1/133621
　　　　　　　　　　　　　　　　　　　　　362/84
2015/0370123 A1* 12/2015 Yang ................ G02F 1/133516
　　　　　　　　　　　　　　　　　　　　　362/84

FOREIGN PATENT DOCUMENTS

| KR | 101250859 B1 | 3/2013 |
| KR | 1020150069776 A | 6/2015 |

* cited by examiner

FIG. 4

COLOR FILTER, METHOD OF MAKING THE SAME, AND DISPLAY DEVICE INCLUDING THE SAME

CROSS-REFERENCE TO RELATED APPLICATIONS

This application claims priority to and the benefit of Korean Patent Application No. 10-2015-0180233 filed in the Korean Intellectual Property Office on Dec. 16, 2015, and all the benefits accruing therefrom under 35 U.S.C. § 119, the content of which in its entirety is herein incorporated by reference.

BACKGROUND

1. Field

The described technology relates to a color filter, a manufacturing method thereof, and a display device including the color filter.

2. Description of the Related Art

A liquid crystal display device (LCD) implements a color by transmitting polarized light which has passed through a liquid crystal layer through an absorptive color filter. The LCD has a viewing angle which is narrow and luminance which is lowered due to low light transmittance of the absorptive color filter. However, when a photoluminescent type of color filter replaces the absorptive color filter, the viewing angle thereof may be widened and the luminance thereof may be improved.

However, in the case of such a photoluminescent type of color filter, a luminous efficiency deterioration phenomenon has been reported. That is, luminous efficiency of a manufactured photoluminescent type of color filter does not reach that of an initially designed ideal photoluminescent type of color filter. Therefore, it is desirable to develop a technique that may minimize the luminous efficiency deterioration phenomenon in a manufacturing process of the photoluminescent type of color filter.

The above information disclosed in this Background section is only for enhancement of understanding of the background of the described technology and therefore it may contain information that does not form the prior art that is already known in this country to a person of ordinary skill in the art.

SUMMARY

An exemplary embodiment provides a color filter including a first region configured to emit a first light, a second region configured to emit a second light that has a longer wavelength than a wavelength of the first light, a third region configured to emit a third light that has a longer wavelength than the wavelength of the second light, a first layer including two or more quantum dots, and a second layer disposed on at least one surface of the first layer, wherein the first layer and the second layer are disposed in at least the second region and the third region.

The second layer may have light transmittance of greater than or equal to about 80% with respect to the first light.

The first light may be blue light.

A thickness of the second layer may be in a range of about 10% to about 60% of a thickness of the first layer.

Each of the first layer and the second layer may include a photosensitive resin.

The first layer may further include a light diffusing agent selected from a metal oxide particle, a metal particle, and a combination thereof.

The quantum dots may include a Group II-VI compound, a Group III-V compound, a Group IV-VI compound, a Group IV compound, a Group II-III-VI compound, a Group I-II-IV-VI compound, or a combination thereof.

The quantum dots may include a plurality of first quantum dots disposed in the second region and configured to emit the second light having a longer wavelength than the wavelength of the first light by absorbing the first light, and a plurality of second quantum dots disposed in the third region and configured to emit the third light having a longer wavelength than the wavelength of the first light and the wavelength of the second light by absorbing the first light.

The first region is includes a transparent body.

Another embodiment provides a method of manufacturing the color filter, the method including forming the first layer on a substrate, forming the second layer on the first layer to obtain a stacked body in which the first layer and the second layer are disposed on the substrate, pre-baking the stacked body, patterning the stacked body to obtain a patterned stacked body, and post-baking the patterned stacked body.

The pre-baked stacked body has a first retention of about 70% to about 100%, wherein the first retention is a percentage of a light conversion rate of the post-baked stacked body with respect to a light conversion rate of the pre-baked stacked body.

The manufacturing method of the color filter may further include aging the stacked body.

The aged stacked body has a second retention of about 85% to about 100%, wherein the second retention is a percentage of a light conversion rate of the aged stacked body with respect to a light conversion rate of the pre-baked stacked body.

The aged stacked body has a third retention of about 100% to about 120%, wherein the third retention is a percentage of a light conversion rage of the aged stacked body with respect to a light conversion rate of the post-baked stacked body.

Yet another embodiment provides a display device including the color filter, the display device including a light source configured to emit the first light in a first direction, a first substrate disposed in front of the light source in the first direction, the color filter disposed in front of the first substrate in the first direction, and a second substrate disposed in front of the color filter in the first direction, wherein in the color filter the first layer is disposed in front of the second layer in the first direction.

The display device may further include a liquid crystal layer interposed between the first substrate and the color filter or between the color filter and the second substrate.

Accordingly, the luminous efficiency deterioration which may occur in a manufacturing process of the color filter may be minimized, and a color filter having excellent luminous efficiency may be provided.

Further, by including the color filter in the display device, both the viewing angle and the luminous efficiency with respect to power consumption of a liquid crystal display device, may be improved.

BRIEF DESCRIPTION OF THE DRAWINGS

The above and other aspects, advantages and features of this disclosure will become more apparent by describing in further detail exemplary embodiments thereof with reference to the accompanying drawings, in which.

DETAILED DESCRIPTION

Hereinafter, the described technology will be described more fully with reference to the accompanying drawings, in which exemplary embodiments are shown. As those skilled in the art would realize, the described embodiments may be modified in various different ways, all without departing from the spirit or scope of the described technology.

In the drawings, the thicknesses of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that, although the terms "first," "second," "third," etc. may be used herein to describe various elements, components, regions, layers, and/or sections, these elements, components, regions, layers, and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Quantum dots (QD) may be applied to various display devices as a complex in which quantum dots are dispersed in a polymer host matrix. The quantum dots may be employed in a light emitting diode (LED) or the like as a light converting layer by being dispersed in a host matrix formed of a polymer or an inorganic material. In the case of the quantum dots, it is possible to uniformly adjust particle sizes and relatively freely adjust the particle sizes in colloid synthesis. When the particle sizes of the quantum dots are equal to or less than about 10 nanometers (nm), a quantum confinement effect indicating that an energy band gap increases as the size decreases becomes prominent, thereby increasing energy density. Since the quantum dots may have theoretical quantum efficiency (QY) of about 100% and may emit light at a high color purity (e.g., a full width half maximum (FWHM) of about 40 nm or less), they improve light emitting efficiency and color reproducibility. Accordingly, the quantum dots may be applied to diverse display devices, if they can be patterned. Further, among such diverse applications, they may contribute to development of a high quality photoluminescent type of LCD in the case of being employed for a color filter of the LCD.

Hereinafter, a part of a color filter in which a first layer and a second layer are formed according to an exemplary embodiment will be schematically described, and an effect of ameliorating luminous efficiency deterioration by the schematic structure of the first layer and the second layer will be described.

Figure 1:
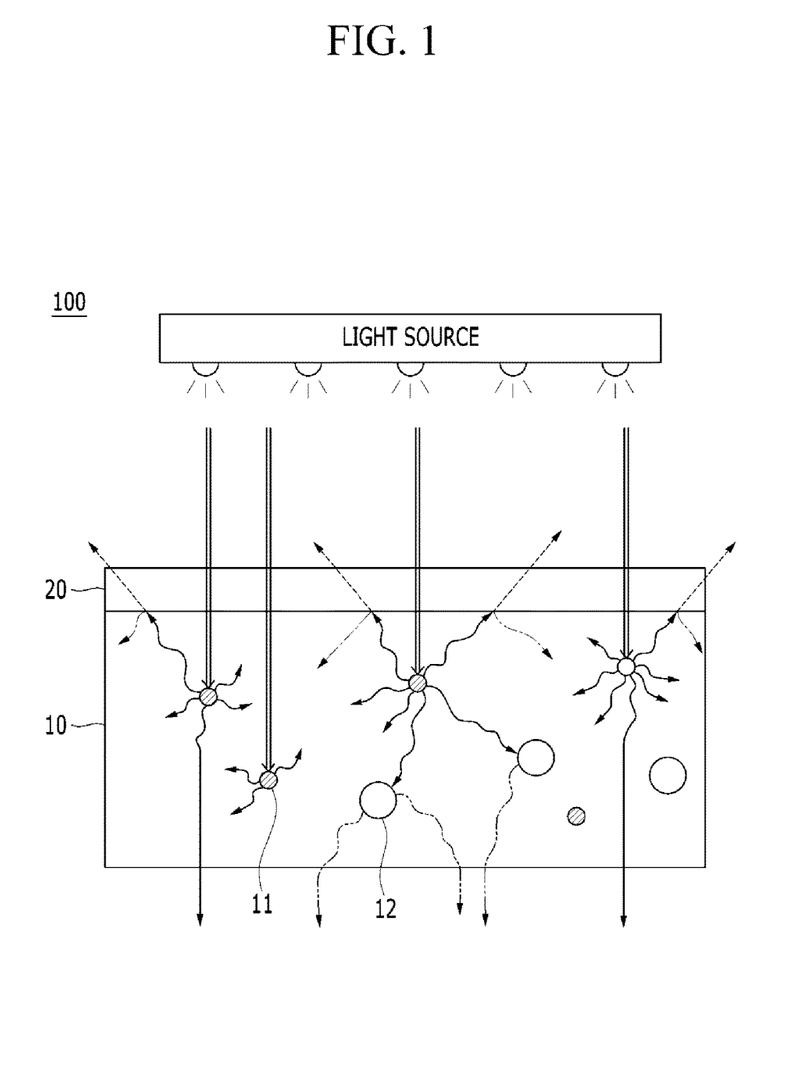
FIG. 1 is a schematic illustration showing an effect of a second layer in a color filter on ameliorating luminous efficiency deterioration according to an exemplary embodiment.

FIG. 1 schematically illustrates the ameliorating effect of the second layer in the color filter on the luminous efficiency deterioration according to the exemplary embodiment.

Referring to FIG. 1, a color filter 100 is a stacked structure including a first layer 10 and a second layer 20 disposed on at least one surface of the first layer 10. The first layer 10 includes two or more quantum dots 11, and the quantum dots 11 are dispersed in the first layer 10.

Since the quantum dots 11 have an isotropic radiation characteristic, the quantum dots 11 may radiate light in a radial direction when an energy state of the quantum dots is excited (e.g. elevated in energy) by incident light received from a light source and then returned to a ground state. Therefore, the first layer 10 including the quantum dots 11 may be employed as a light emitting layer. In FIG. 1, a double-lined arrow represents a path of incident light, and a solid-lined arrow represents a path of radiated light.

Since the quantum dots 11 have a discrete energy band gap caused by a quantum confinement effect, the quantum dots 11 may radiate light having a certain wavelength range by receiving the incident light. Accordingly, since the first layer 10 includes two or more of the quantum dots 11, the first layer 10 according to the present exemplary embodiment may display an image at higher color purity than the first layer including a different light emitting material.

The first layer 10 may further include light diffusing agents 12. The light diffusing agents 12 may be dispersed in the first layer 10 together with the quantum dots 11. The light diffusing agents 12 may guide the incident light to the quantum dots 11 or may guide the light radiated from the quantum dots 11 outside of the first layer 10. Accordingly, luminous efficiency deterioration of the first layer 10 may be minimized. In FIG. 1, a two-point chain lined arrow represents a path of light guided by the light diffusing agents 12.

For example, the second layer 20 may be disposed on one surface of the first layer 10, serving as an incident surface into which the incident light is introduced as shown in FIG. 1, but it is not limited thereto. Alternatively, the second layer 20 may be disposed on each of opposite surfaces of the first layer 10.

The second layer 20 may be formed of an optically transparent material. For example, the second layer 20 may be formed of a material having excellent light transmittance for a certain wavelength range.

For example, when the incident light illustrated in FIG. 1 is blue light that has a wavelength range of about 500 nanometers (nm) or less, the second layer 20 may be formed of a material having excellent light transmittance for a wavelength range of about 500 nm or more. For example, the second layer 20 may be formed of a material having light transmittance of about 80% or more, about 85% or more, or about 90% or more, for light having the wavelength range of about 500 nm or less.

Further, for example, the second layer 20 may be formed to have a similar refractive index to that of the first layer 10. Accordingly, a case where the incident light introduced into the second layer 20 is reflected or scattered by the second layer 20 may be minimized. In other words, an optical loss generated at an interface between the second layer 20 and the first layer 10 may be minimized.

In the present exemplary embodiment, the second layer 20 is formed as a single layer on the first layer 10 as shown in FIG. 1, but the present exemplary embodiment is not limited thereto. For example, the second layer 20 may be formed as a multilayer including two or more layers.

In the present exemplary embodiment, the second layer 20 may reflect some of the radiated light, which returns toward the light source due to an isotropic radiation characteristic of the quantum dots 11, to guide it in an opposite direction to that of the second layer 20. In FIG. 1, a one-point chain lined arrow represents a path of reflected light which is reflected by the second layer 20, and a dash lined arrow represents a path of transmitted light, which returns to the light source by being transmitted through the second layer 20.

For example, when the second layer 20 is interposed between the first layer 10 and the light source as in the present exemplary embodiment, light-recycling of the radiated light may be possible by reflecting some of the radiated light, which returns toward the light source due to the isotropic radiation characteristic of the quantum dots 11, thereby allowing the light to remain in the first layer 10 by guiding it in the opposite direction to that of the second layer 20, or the like. As a result, the second layer 20 may serve as an optical barrier layer that compensates for the luminous efficiency of the first layer 10, e.g., the light emitting layer. Accordingly, it is possible to provide a color filter that may minimize luminous efficiency deterioration.

A thickness of the second layer 20 may be in a range of about 5% to about 100%, or about 10% to about 60%, of the thickness of the first layer 10.

When the second layer 20 has a thickness that is less than about 5% of the thickness of the first layer 10, the ameliorating effect of the luminous efficiency deterioration of the first layer 10 by the action of the second layer 20 may be insignificant, and when the second layer 20 has a thickness exceeding about 100% of the thickness of the first layer 10, a light loss of the incident light due to the action of the second layer 20 may be increased. However, the aforementioned light-recycling of the radiated light by the action of the second layer 20 may be effectively performed by forming the second layer 20 to have the thickness in the above-described range.

Hereinafter, materials of the first layer 10 and the second layer 20 in the color filter 100 according to the present exemplary embodiment will be described.

In the present exemplary embodiment, each of the first layer 10 and the second layer 20 may be formed of a photosensitive resin. Accordingly, the color filter 100 may be readily patterned by a photolithographic method.

In the present exemplary embodiment, the photosensitive resins used to form the first layer 10 and the second layer 20 may each include a binder, a photopolymerization monomer including a carbon-carbon double bond, a photoinitiator, a solvent, and a curing agent in common.

In the present exemplary embodiment, the binder may be a carboxylic binder including a carboxyl group (—COOH). For example, the binder may be a copolymer of a monomer mixture that includes a first monomer including the carboxyl group and the carbon-carbon double bond, and a second monomer including the carbon-carbon double bond and a hydrophobic moiety but not a carboxyl group. The quantum dots 11 are dispersed, e.g., spaced apart from each other, in the first layer 10 by the binder including a carboxyl group to form a quantum dot-polymer complex structure.

For example, the first monomer may include a compound including a carboxylic acid, an ethylenically unsaturated group such as acrylic acid, methacrylic acid, maleic acid, itaconic acid, fumaric acid, 3-butenoic acid, vinyl acetate, vinyl benzoic acid, or the like, but it is not limited thereto. The first monomer may include one or more compounds.

For example, the second monomer may include an alkenyl aromatic compound such as styrene, alpha-methyl styrene, vinyl toluene, vinyl benzyl methyl ether, or the like;

an unsaturated carboxylic acid ester compound such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, phenyl methacrylate, or the like; an unsaturated carboxylic acid amino alkyl ester compound such as 2-amino ethyl acrylate, 2-amino ethyl methacrylate, 2-dimethyl amino ethyl acrylate, N-phenylmaleimide, N-benzylmaleimide, N-alkylmaleimide, 2-dimethyl amino ethyl methacrylate, or the like; an unsaturated carboxylic acid glycidyl ester compound such as glycidyl acrylate, glycidyl methacrylate, or the like; a cyano-substituted vinyl compound such as acrylonitrile, methacrylonitrile, or the like; and an unsaturated amide compound such as acrylamide, methacrylamide, or the like, but it is not limited thereto. One or more compounds may be employed as the second monomer.

The photoinitiator initiates photopolymerization between the above photopolymerization monomers. In the present exemplary embodiment, the photoinitiator may include a triazine-based compound, an acetophenone-based compound, a benzophenone-based compound, a thioxanthone-based compound, a benzoin-based compound, an oxime-based compound, or a combination thereof, but is not limited thereto.

Examples of the triazine-based compound may include 2,4,6-trichloro-s-triazine, 2-phenyl-4,6-bis(trichloromethyl)-s-triazine, 2-(3',4'-dimethoxy-styryl)-4,6-bis(trichloromethyl)-s-triazine, 2-(4'-methoxy-naphthyl)-4,6-bis(trichloromethyl)-s-triazine, 2-(p-methoxyphenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, bis(trichloromethyl)-6-styryl-s-triazine, 2-(naphtho-1-il)-4,6-bis(trichloromethyl)-s-triazine, 2-(4-methoxy-naphtho-1-il)-4,6-bis(trichloromethyl)-s-triazine, 2,4-trichloromethyl(piperonyl)-6-triazine, 2,4-(trichloromethyl(4'-methoxystyryl)-6-triazine, but they are not limited thereto.

Examples of the acetophenone-based compound may include 2,2'-diethoxyacetophenone, 2,2'-dibutoxyacetophenone, 2-hydroxy-2-methylpropiophenone, p-t-butyl trichloroacetophenone, p-t-butyl dichloroacetophenone, 4-chloroacetophenone, 2,2'-dichloro-4-phenoxy acetophenone, 2-methyl-1-(4-(methylthio)phenyl)-2-morpholino propane-1-on, 2-benzyl-2-dimethylamino-1-(4-morpholinophenyl)-butan-1-on, or the like, but they are not limited thereto.

Examples of the benzophenone-based compound may include benzophenone, benzoyl benzoic acid, benzoyl benzoic acid methyl, 4-phenyl benzophenone, hydroxy benzophenone, acrylic-benzophenone, 4,4'-bis(dimethylamino) benzophenone, 4,4'-dichlorobenzophenone, 3,3'-dimethyl-2-methoxy benzophenone, or the like, but they are not limited thereto.

Examples of the thioxanthone-based compound may include thioxanthone, 2-methyl thioxanthone, isopropylthioxanthone, 2,4-diethyl thioxanthone, 2,4-diisopropyl thioxanthone, 2-chloro thioxanthone, or the like, but they are not limited thereto.

Examples of the benzoin-based compound may include benzoin, benzoin methyl ether, benzoin ethyl ether, benzoin isopropyl ether, benzoin isobutyl ether, benzyl dimethyl ketal, or the like, but they are not limited thereto.

Examples of the oxime-based compound may include 2-(o-benzoyloxime)-1-[4-(phenylthio)phenyl]-1,2-octandione 1-(o-acetyloxime)-1-[9-ethyl-6-(2-methylbenzoyl)-9H-carbazole-3-il]ethanone, but they are not limited thereto.

In addition to the above photoinitiator, a carbazole-based compound, a diketone-based compound, a sulfonium borate-based compound, a diazo-based compound, a biimidazole-based compound, or the like, or a combination thereof may be employed as the photoinitiator.

In the present exemplary embodiment, a photosensitive composition may include diverse additives such as a leveling agent, a coupling agent, and the like. An amount of the additives is not particularly limited, and may be appropriately adjusted by a skilled person without undue experimentation to be within a range which does not adversely affect the photosensitive composition or a pattern formed therefrom.

The leveling agent serves to prevent the formation of stains and spots in a film and to improve a leveling characteristic of the film. Detailed examples of the leveling agent will be described as follows, but they are not limited thereto.

The examples of the leveling agent may include a commercial product of a fluorine-based leveling agent such as BM-1000®, BM-1100®, or the like (BM Chemie Group); MEGAFACE F 142D®, MEGAFACE F 172®, MEGAFACE F 173®, MEGAFACE F 183®, or the like (Dainippon Ink Kagaku Kogyo Co., Ltd.); FULORAD FC-135®, FULORAD FC-170C®, FULORAD FC-430®, FULORAD FC-431®, or the like (Sumitomo 3M Co., Ltd.); SURFLON S-112®, SURFLON S-113®, SURFLON S-131®, SURFLON S-141®, SURFLON S-145®, or the like (Asahi Glass Co., Ltd.); or SH-28PA®, SH-190®, SH-193®, SZ-6032®, SF-8428®, or the like (Toray Silicone Co., Ltd.).

The leveling agent may be readily adjusted by a skilled person without undue experimentation depending on a desired property.

The coupling agent serves to improve adhesion to the substrate, and may include a silane-based coupling agent. Detailed examples of the silane-based coupling agent may include vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, or the like, or a combination thereof may be used.

In the present exemplary embodiment, the amount of the solvent may be appropriately adjusted in consideration of the amounts of the aforementioned elements (the binder, the photopolymerization monomer, the photoinitiator, and the additives) and/or amounts of the quantum dots 11, and the light diffusing agents 12, which will be described later.

Specifically, the amount of the solvent is the amount of the photosensitive resin excluding the amount of a solid component (non-volatile component), and may be appropriately adjusted in consideration of the compatibility of the solvent with other components (e.g., the binder, the photopolymerization monomer, the photoinitiator, the additives, and/or the quantum dots and light diffusing agent), compatibility of the solvent with an alkali development solution, a boiling temperature of the solvent, and the like. Examples of the solvent may include an ethylene glycol compound such as ethyl 3-ethoxypropionate, ethylene glycol, diethylene glycol, polyethylene glycol, or the like; a glycol ether compound such as ethylene glycol monomethyl ether, ethylene glycol monoethyl ether, diethylene glycol monomethyl ether, ethylene glycol diethyl ether, diethylene glycol dimethyl ether, or the like; a glycol ether acetate compound such as ethylene glycol acetate, ethylene glycol monoethyl ether acetate, diethylene glycol monoethyl ether acetate, diethylene glycol monobutyl ether acetate, or the like; a propylene glycol compound such as propylene glycol or the like; a propylene glycol ether compound such as propylene glycol monomethyl ether, propylene glycol monoethyl ether, propylene glycol monopropyl ether, propylene monobutyl ether, propylene glycol dimethyl ether, dipropylene glycol dimethyl ether, propylene glycol diethyl ether, dipropylene glycol diethyl ether, or the like; a propylene glycol ether acetate compound such as propylene glycol monomethyl ether acetate, dipropylene glycol monoethyl ether acetate, or the like; an amide compound such as N-methylpyrrolidone, dimethylformamide, dimethylacetamide, or the like; a ketone compound such as methyl ethyl ketone (MEK), methyl isobutyl ketone (MIBK), cyclohexanone, or the like; a petroleum compound such as toluene, xylene, solvent naphtha, or the like; an ester compound such as ethyl acetate, butyl acetate, ethyl lactate, or the like; an ether compound such as diethyl ether, dipropyl ether, dibutyl ether, or the like; and a combination thereof.

In the present exemplary embodiment, the curing agent may include a thiol-based curing agent. The thiol-based curing agent may be a compound including one or more thiol groups that react with the carbon-carbon double bond of the photopolymerization monomer and which reacts primarily with the photopolymerization monomer during a heat-curing process.

In the present exemplary embodiment, the thiol-based curing agent is not particularly limited as long as it includes at least one thiol group in its molecular structure.

In the present exemplary embodiment, examples of the thiol curing agent may include ethoxylated trimethylolpropane tris(3-mercaptopropionate), trimethylolpropane tris(3-mercaptopropionate), glycol di(3-mercaptopropionate), pentaerythritol tetra(3-mercaptopropionate), 4-mercaptomethyl-3,6-dithia-1,8-octanedithiol, pentaerythritol tetrakis(3-mercaptoacetate), trimethylolpropane tris(3-mercaptoacetate), 4-t-butyl-1,2-benzenedithiol, 2-mercaptoethylsulfide, 4,4'-thiodibenzenethiol, benzenedithiol, glycol dimercaptoacetate, glycol dimercaptopropionate ethylene bis(3-mercaptopropionate), polyethylene glycol dimercaptoacetate, polyethylene glycol di(3-mercaptopropionate), or the like, or a combination thereof.

The thiol curing agent may primarily serve to heat-cure the photosensitive resin during a pre-baking step or the like, and may also serve, for example, to prevent damage to the quantum dots inside the photosensitive resin of which the first layer is formed throughout an entire process of manufacturing the color filter.

The photosensitive resin for forming the first layer 10 may further include the aforementioned quantum dots 11 and light diffusing agents 12 in addition to the above components. As a result, the first layer 10 may have a light emitting characteristic since the first layer 10 further includes the quantum dots 11, and the ameliorating effect of the first layer 10 on the luminous efficiency deterioration may be improved since the first layer 10 further includes the light diffusing agents 12.

In the present exemplary embodiment, the quantum dots 11 are not particularly limited, and any known or commercially available quantum dots may be employed.

For example, the quantum dots 11 may include a Group II-VI compound, a Group III-V compound, a Group IV-VI compound, a Group IV compound, a Group II-III-VI compound, a Group I-II-IV-VI compound, or a combination thereof, wherein each Group refers to a Group of the Periodic Table of the Elements.

For the Group II-VI compound, a binary compound selected from CdSe, CdTe, ZnS, ZnSe, ZnTe, ZnO, HgS, HgSe, HgTe, MgSe, MgS, and a combination thereof; a ternary compound selected from CdSeS, CdSeTe, CdالسTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a combination thereof; or a quaternary compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a combination thereof, may be employed. For the Group III-V compound, a binary compound selected from GaN, GaP, GaAs, GaSb, AlN, AlP, AlAs, AlSb, InN, InP, InAs, InSb, and a combination thereof; a ternary compound selected from GaNP, GaNAs, GaNSb, GaPAs, GaPSb, AlNP, AlNAs, AlNSb, AlPAs, AlPSb, InNP, InNAs, InNSb, InPAs, InPSb, and a combination thereof; or a quaternary compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and a combination thereof, may be employed. For the Group IV-VI compound, a binary compound selected SnS, SnSe, SnTe, PbS, PbSe, PbTe, and a combination thereof; a ternary compound selected from SnSeS, SnSeTe, SnSTe, PbSeS, PbSeTe, PbSTe, SnPbS, SnPbSe, SnPbTe, and a combination thereof; or a quaternary compound selected from SnPbSSe, SnPbSeTe, SnPbSTe, and a combination thereof, may be employed. Examples of the Group compound may include CuInSe2, CuInS2, CuInGaSe, or CuInGaS, or a combination thereof, but they are not limited thereto. Examples of the Group I-II-IV-VI compound may include CuZnSnSe, CuZnSnS, or a combination thereof, but they are not limited thereto. For the Group IV compound, a unary compound selected from Si, Ge, and a combination thereof; and a binary compound selected from SiC, SiGe, and a combination thereof, may be employed.

The binary compound, the ternary compound, or the quaternary compound may exist in a uniform concentration or in a partially different concentration in the quantum dot particles.

In the present exemplary embodiment, the quantum dots may have a core/shell structure in which one quantum dot surrounds another quantum dot. An interface between a core and a shell may have a concentration gradient such that a concentration of an element in the shell decreases toward a center of the quantum dot. Further, the quantum dots may have a structure including a semiconductor nanocrystal core and a multi-layered shell which surrounds the semiconductor nanocrystal core. In this case, the multi-layered shell may have two or more layers each of which may include a single composition or an alloy, or a concentration gradient.

Further, the quantum dots may have a structure in which a composition of the shell has a larger energy band gap than that of the core, thereby enhancing the quantum confinement effect. Also in the case of the multi-layered shell, the composition of an outer shell may have a larger energy band gap than that of an inner shell. In this case, the quantum dots may have a wavelength excitation range from an ultraviolet region to an infrared region.

The quantum dots may have a quantum efficiency of about 10% or more, for example, about 30% or more, about 50% or more, about 60% or more, about 70% or more, or about 90% or more.

Further, the quantum dots may have a narrow spectrum to improve color purity or color reproducibility of the display device. The quantum dots may have a full width at half maximum (FWHM) of a light emitting spectrum of about 45 nm, or, for example, about 40 nm or more, or about 30 nm or more. In this range, the color purity and the color reproducibility of the display device may be improved.

The quantum dots 11 are spherically illustrated in FIG. 1 for convenience of illustration, but are not limited thereto. The quantum dots 11 may have any general shape in the art and are not particularly limited. For example, the quantum dots may be a nanoparticle having a spherical shape, a pyramid shape, a multi-arm shape, or a cube shape, or may be a nanotube shape, a nanowire shape, a nanofiber shape, or a nanosheet shape.

The quantum dots may have a diameter that is in a range of about 1 nm to about 100 nm. For example, in the present exemplary embodiment, the quantum dots may have a diameter that is in a range of about 1 nm to about 20 nm, for example, about 2 nm to about 15 nm, or about 3 nm to about 15 nm. In the case where the quantum dots have a non-spherical shape, the diameter refers to the furthest distance between two points on the quantum dots.

The light diffusing agents 12 may minimize the luminous efficiency deterioration due to the isotropic radiation characteristic in the first layer 10, since the light diffusing agents 12 diffuse the incident light in various directions in the first layer 10 as described above. The light diffusing agents 12 may include inorganic oxide particles such as alumina particles, silica particles, zirconia particles, zinc oxide particles, titanium oxide particles, or metal particles such as gold particles, silver particles, copper particles, platinum particles, or a combination thereof, but they are not limited thereto.

As such, the first layer 10 and the second layer 20 according to the present exemplary embodiment include a photosensitive material formed of the above-described photosensitive resin. Accordingly, a photolithographic pattern formed of a quantum dot-polymer complex can be readily formed by the photolithographic method, even when the quantum dots 11 do not include a photopolymerization functional group (e.g., the carbon-carbon double bond such as methacrylate, acrylate, or the like). Further, a surface treatment of the quantum dot may be omitted, and use of an organic solvent may be excluded when a development process, which will be described later, is performed.

Hereinafter, a detailed structure of the color filter 100 according to an exemplary embodiment will be described with reference to FIG. 2.

Figure 2:
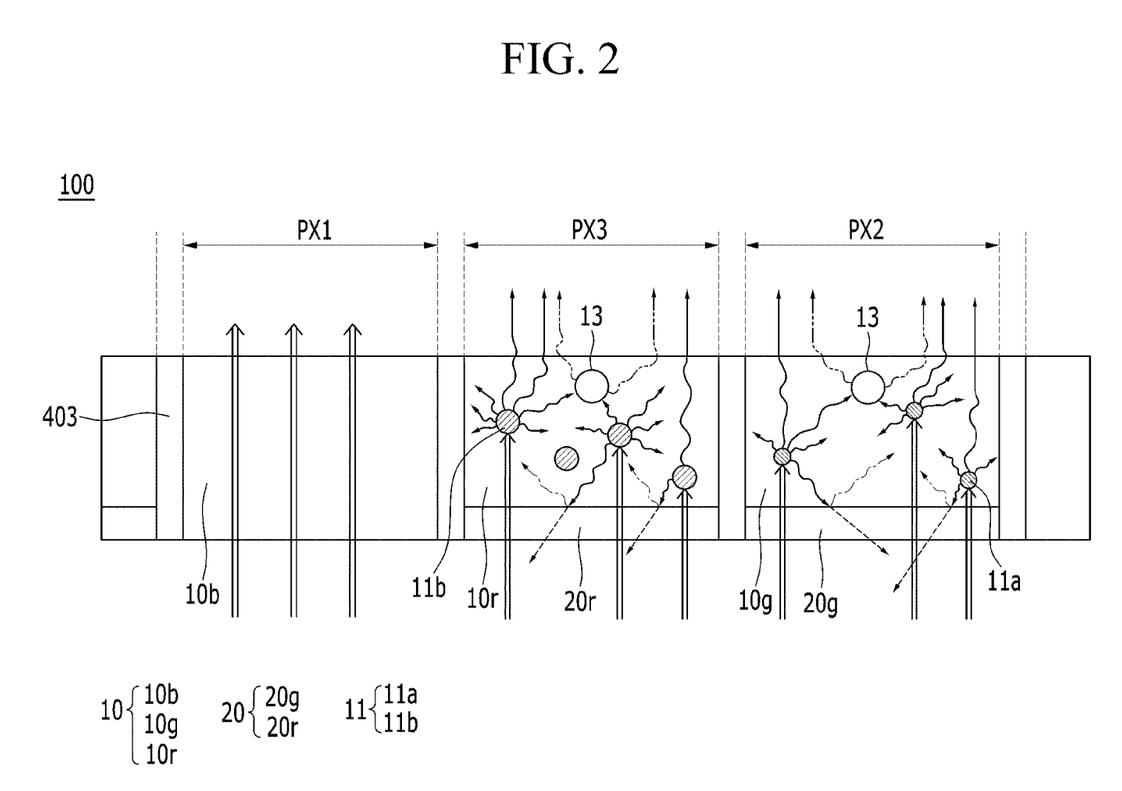
FIG. 2 is an illustration of the color filter in FIG. 1.

FIG. 2 specifically illustrates the color filter of FIG. 1.

In the present exemplary embodiment, the color filter 100 may be divided into a first region PX1 for displaying first light, a second region PX2 for displaying second light, and a third region PX3 for displaying third light. Each region is separated by light blocking members 403. Further, the first region PX1, the second region PX2, and the third region PX3 are regularly arranged in a predetermined form. For example, in a direction from a left side to a right side in FIG. 2, an arrangement in which the first region PX1, the third region PX3, and the second region PX2 are sequentially disposed is referred to as one unit region. Two or more unit regions may be regularly and repeatedly arranged. Further, such unit regions may be repeatedly arranged in a two dimensional form, e.g., in a matrix shape. However, the arrangement sequence, direction, and the like of the first region PX1 to the third region PX3 may be diversely determined.

In the present exemplary embodiment, in the color filter 100, the first region PX1 may display blue light as the first light, the second region PX2 may display green light as the second light, and the third region PX3 may display red light as the third light.

The color filter 100 may be a "blue-light color filter" that displays blue light, green light, and red light by receiving the first light. As a result, the first layer 10 and the second layer 20 may not be formed in the first region PX1 that displays blue light, and may instead be formed in each of the second region PX2 and the third region PX3. The first region PX1 may be filled with transparent bodies.

However, an operation of the color filter and a configuration depending on the operation are not limited thereto, and the color filter may display blue light, green light, and red light by receiving white light or ultraviolet light. In this case, the first layer 10 and the second layer 20 may be formed in each of the first region PX1 to the third region PX3.

Hereinafter, the color filter 100 according to the present exemplary embodiment will be described using the "blue-light color filter" as an example for convenience of description. A blue filter 10b designates a transparent body that is filled in the first region PX1, a green filter 10g designates the first layer formed in the second region PX2, a green barrier layer 20g designates the second layer formed in the second region PX2, a red filter 10r designates the first layer formed in the third region PX3, and a red barrier layer 20r designates the second layer formed in the third region PX3.

The first region PX1 includes the blue filter 10b. The blue filter 10b may be formed of the transparent body and the quantum dots are not included therein. The blue filter 10b thus displays the blue light that is incident light by emitting the blue light.

The transparent bodies may fill the first region PX1 as shown in FIG. 2, but may have various heights, sizes, or the like depending on exemplary embodiments. The transparent bodies may include scattering-induced particles that change a projecting direction of the blue light, while maintaining a wavelength thereof as unchanged. Alternatively, the transparent bodies may be omitted depending on exemplary embodiments. In this case, a hollow space may be formed in the first region PX1, and the hollow space may serve as the blue filter 10b.

Meanwhile, the second layer 20 may not be formed in the first region PX1. This is because, in the case of the exemplarily described blue-light color filter, it is difficult to expect a light-recycling effect by the action of the second layer 20. However, in the case that the color filter 100 of the present exemplary embodiment is a white filter of an ultraviolet filter, the first layer 10b including the quantum dots which radiate the blue light and the second layer for minimizing the luminous efficiency deterioration of the first layer may be formed in the first region PX1 instead of the aforementioned transparent bodies.

The second region PX2 includes the green filter 10g and the green barrier layer 20g. The green filter 10g includes first quantum dots 11a that radiate the green light when the energy states of the quantum dots 11a are excited by receiving blue incident light and return to the ground state. Since some of the radiated green light is reflected by the green barrier layer 20g, a projecting passing direction of the radiated green light is changed so that the reflected light is radiated outside the green filter 10g, and thus the reflected light displays a green color. Accordingly, the luminous efficiency deterioration of the green light displayed in the second region PX2 may be minimized.

The third region PX3 includes the red filter 10r and the red barrier layer 20r. The red filter 10r includes second quantum dots 11b that radiate the red light when the energy states of the second quantum dots 11b are excited by receiving the blue incident light and return to the ground state. Since some of the radiated red light is reflected by the red barrier layer 20r, a projecting passing direction of the radiated red light is changed so that the reflected light is radiated outside the red filter 10r, and thus the reflected light displays a red color. Accordingly, the luminous efficiency deterioration of the red light displayed in the third region PX3 may be minimized.

Meanwhile, the first quantum dots 11a and the second quantum dots 11b are formed of the same material, while having different sizes from each other in order to radiate lights having different wavelengths, e.g., the green light and the red light.

For example, the first quantum dots 11a may have a smaller size (e.g. diameter) than those of the second quantum dots 11b in order to radiate green light of a relatively high energy. For example, the first quantum dots 11a may have a center wavelength of about 530±10 nm and a FWHM of about 40~60 nm. In comparison, the second quantum dots 11b may have a larger size than those of the first quantum dots 11a in order to radiate red light having a relatively low energy. For example, the second quantum dots may have a center wavelength of about 625±10 nm and a FWHM of about 40~60 nm.

Meanwhile, in the present exemplary embodiment, the blue light is converted into the green light or the red light by the action of the first quantum dots 11a or the second quantum dots 11b. Further, the converted light is scattered by the light diffusing agents 12 and the scattering-induced particles to be externally radiated from the color filter 100. Accordingly, the light is widely externally radiated and has a uniform light gradation regardless of a position of a viewer. Accordingly, the color filter 100 having a wide viewing angle may be provided.

As described above, the color filter 100 according to the exemplary embodiment may minimize the luminous efficiency deterioration of the first layer 10 that serves as the light emitting layer and the filter, by including the second layer 20 that serves as the optical barrier layer.

Hereinafter, a display device including the color filter in FIG. 2 will be described with reference to FIG. 3. In an exemplary embodiment, a liquid crystal display device is described as an example of the display device including the color filter, but the range of the exemplary embodiment is not limited thereto, and the color filter may be employed in various display devices such as an organic light emitting diode display, a light emitting diode display, or the like.

Figure 3:
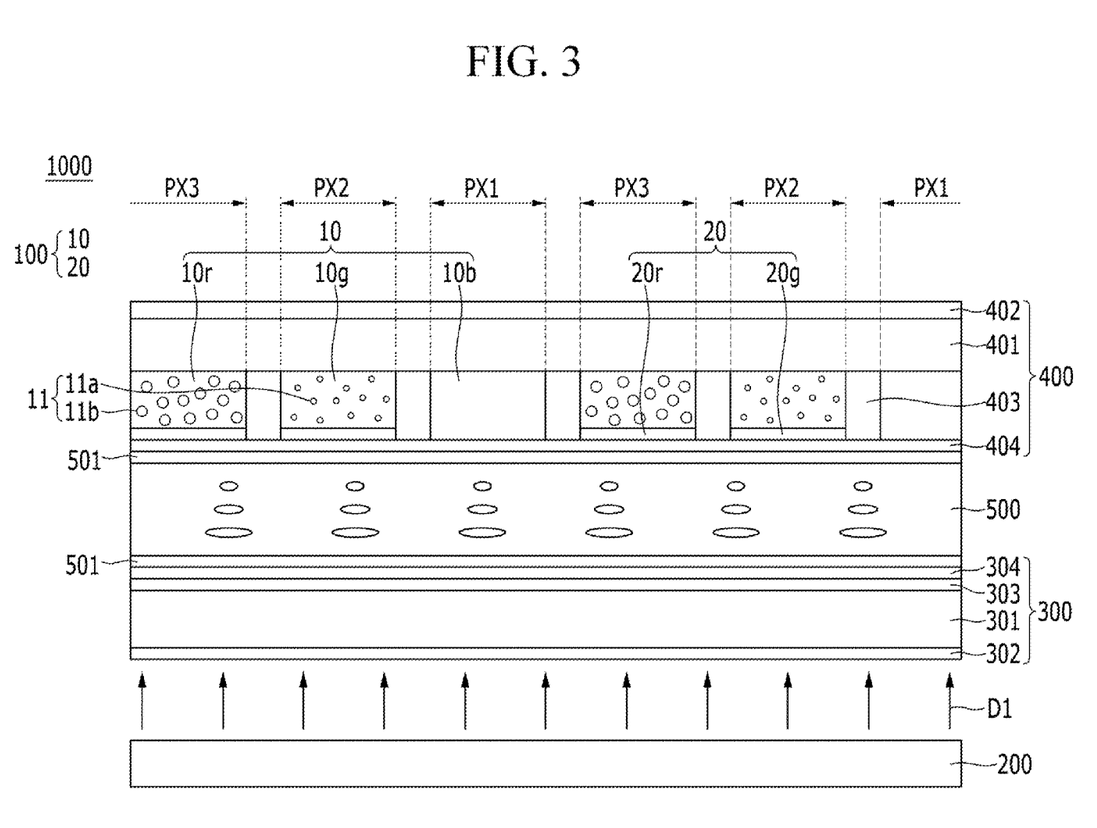
FIG. 3 is a cross-sectional illustration of a display device including the color filter of FIG. 2.

FIG. 3 illustrates a display device including the color filter of FIG. 2.

Referring to FIG. 3, a display device 1000 according to the present exemplary embodiment includes a light source 200, a lower display panel 300, and an upper display panel 400.

The light source 200 may supply first light to the lower display panel 300 and the upper display panel 400 in a first direction D1 of FIG. 3. The light source 200 may include an emitting body that emits the first light. For example, the first light emitted by the light source 200 may have a visible wavelength range, and may be light having high energy in the visible wavelength range, e.g., blue light. As such, the blue light, which is the first light, may be supplied to the lower display panel 300 and the upper display panel 400. However, the first light is not limited thereto, and may be any light other than the blue light in the visible wavelength range, or alternatively, may be ultraviolet light in an ultraviolet wavelength range.

The light source 200 may include an emitting portion (not shown) that includes an emitting body and a light guiding plate that guides the emitted blue light toward the lower display panel 300. The emitting portion may be disposed at one side of the light guiding plate or may be disposed below a lower surface of the light guiding plate.

The lower display panel 300 may include a first substrate 301 formed of transparent glass, plastic, or the like, and a wiring layer 303 formed on the first substrate 301. The wiring layer 303 may include a thin film transistor (not shown) including a gate line, a storage voltage line, a gate insulating layer, a data line, a source electrode, a drain electrode, a semiconductor, a passivation film, and the like, and the thin film transistor thereof is connected to the gate line and the data line. Meanwhile, a pixel electrode 304 is formed on the wiring layer 303. The gate line, the data line, the source electrode, the drain electrode, the semiconductor, and the pixel electrode may have various structures depending on exemplary embodiments.

The gate line and the storage voltage line are electrically separated from each other, and the data line is insulated from and intersects the gate line and the storage voltage line. The gate electrode, the source electrode, and the drain electrode respectively serve as a control terminal, an input terminal, and an output terminal of the thin film transistor. The drain electrode is electrically connected to the pixel electrode 304.

The pixel electrode 304 may be formed of a transparent conductive material such as indium tin oxide (ITO) or indium zinc oxide (IZO), and may control an alignment direction of liquid crystal molecules by generating an electric field.

An alignment layer 501 is disposed on the pixel electrode 304. The alignment layer 501 is a liquid crystal alignment layer including polyamic acid, polysiloxane, polyimide, or the like, and may include at least one of generally-used materials. The liquid crystal molecules in a liquid crystal layer 500 may be initially aligned by the alignment layer 501. The alignment layer 501 may be variously disposed depending on exemplary embodiments. The alignment layer 501 may be disposed at an upper side or a lower side of the liquid crystal layer 500, or may be disposed at both of the upper side and the lower side of the liquid crystal layer 500 as shown in FIG. 3. In some cases, the alignment layer 501 may be omitted.

The liquid crystal layer 500 is formed between the lower display panel 300 and the upper display panel 400. The thickness of the liquid crystal layer 500 may be in a range of, e.g., about 5 to 6 μm. The types of the liquid crystal molecules in the liquid crystal layer 500 and an operation of the liquid crystal layer 500 may vary depending on exemplary embodiments. Specifically, the liquid crystal layer 500 may be interposed between the first substrate 301 and the color filter 100 as shown in FIG. 3, or may be interposed between a second substrate 401 and the color filter 100, depending on the operation thereof.

A first polarizing plate 302 is attached on a rear surface of the first substrate 301. The first polarizing plate 302 may include a polarizing element (not shown) and a passivation layer (not shown), and the passivation layer may include tri-acetyl-cellulose (TAC). Alternatively, the first polarizing plate 302 may be interposed between the first substrate 301 and the wiring layer 303 or may be disposed at another position in the lower display panel 300.

A common electrode 404 is disposed on the liquid crystal layer 500. The common electrode 404 may be formed of the transparent conductive material such as indium tin oxide (ITO) or indium zinc oxide (IZO), and may control the alignment direction of the liquid crystal molecules by generating the electric field. However, the common electrode 404 may be disposed variously depending on exemplary embodiments, or may be disposed in the lower display panel 300.

The upper display panel 400 may include the second substrate 401 formed of transparent glass, plastic, or the like, and a second polarizing plate 402 disposed thereon. The second polarizing plate 402 may include the polarizing element and the passivation layer, and the passivation layer may include tri-acetyl-cellulose (TAC). In the present exemplary embodiment, the second polarizing plate 402 is disposed on the second substrate 401, but may be disposed at another position in the upper display panel 400, for example, on the common electrode 404 or under the second substrate 401. In some cases, the second polarizing plate 402 may be omitted.

The aforementioned color filter 100 is disposed under the second substrate 401, and the color filter 100 is divided into the first region PX1, the second region PX2, and the third region PX3 by the light blocking members 403 as described above.

The light blocking members 403 may be formed of a light blocking material including, e.g., metal particles of chromium (Cr), silver (Ag), molybdenum (Mo), nickel (Ni), titanium (Ti), tantalum (Ta), or the like, an oxide of the metal particles, or a combination thereof. The light blocking members 403 prevent light leakage from the display device 1000 and improve the contrast thereof. The light blocking members 403 are disposed under the second substrate 401, and are spaced apart from each other by a predetermined distance therebetween as shown in FIG. 3.

In the present exemplary embodiment, since the color filter 100 is thoroughly divided into each region by the light blocking members 403, the light introduced into one region is prevented from intruding into another region, thereby preventing color mixture between the red, green, and blue lights displayed by the display device 1000.

Meanwhile, the color filter 100 is disposed in front of the first substrate 301. Specifically, the first substrate 301, the color filter 100, and the second substrate 401 are sequentially disposed in front of the light source in the first direction D1 that is a supply direction of the first light.

In the present exemplary embodiment, the color filter 100 may be disposed in the upper display panel 400, but it is not limited thereto. For example, the color filter 100 may be disposed in the lower display panel 300 depending upon an operation type of the display device 1000.

Herein, based on the first direction D1, the first layer 10 (e.g. 10b, 10g, 10r) is disposed in front of the second layer 20 (e.g. 20g, 20r) in the color filter 100. In other words, as shown in FIG. 3, the color filter 100 has a structure in which the first light is introduced into the green filter 10g or the red filter 10r, which are the first layer, through the green barrier layer 20g or the red barrier layer 20r, which are the second layer.

As such, it is possible to provide the display device 1000 which can minimize the luminous efficiency deterioration of the first layer 10 caused by the isotropic radiation characteristic of the quantum dots by adjusting a disposition direction of the color filter 100 such that the first light is introduced into the first layer 10 through the second layer 20.

Meanwhile, in a manufacturing process of the color filter 100 formed of the photosensitive material, the deterioration of the luminous efficiency of the quantum dots has been reported to occur in each of the photolithographic processes such as exposure, development, baking, and the like. However, in the case of the color filter 100 of the aforementioned exemplary embodiment, it is possible to manufacture a color filter capable of minimizing luminous efficiency deterioration in the photolithographic processes by forming a stacked body in which the second layer 20 that serves as the optical barrier layer is disposed on the first layer 10 that serves as a filter layer in the photolithographic processes.

Hereinafter, a method of manufacturing a color filter that minimizes luminous efficiency deterioration in a manufacturing process according to an exemplary embodiment will be described.

Figure 4:
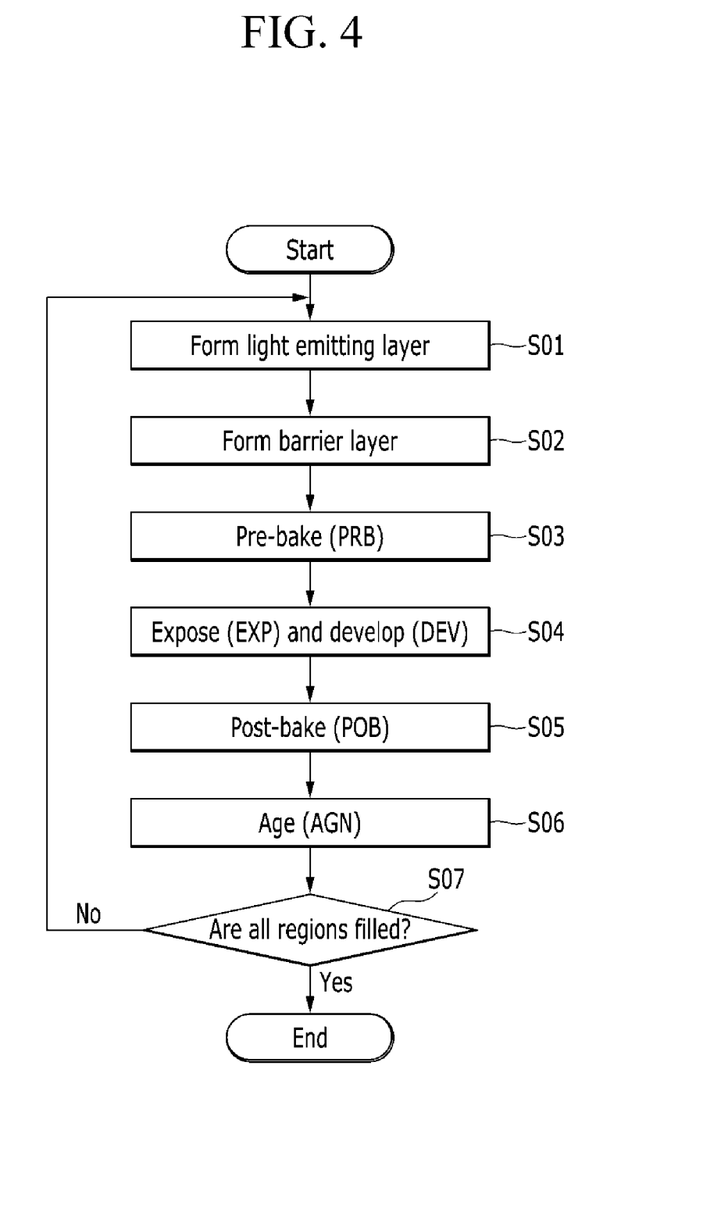
FIG. 4 is a flowchart showing a method of manufacturing the color filter of FIG. 2.

FIG. 4 is a flowchart showing the manufacturing method of the color filter of FIG. 2.

Referring to FIG. 4, the manufacturing method of the color filter according to the exemplary embodiment includes forming a light emitting layer (e.g. first layer) on a substrate (S01), forming a barrier layer (e.g. second layer) on the first layer to obtain a stacked body in which the first layer and the second layer are stacked on the substrate (S02), pre-baking the stacked body (S03), exposing and developing (e.g. patterning) the stacked body to obtain the patterned stacked body (S04), post-baking the patterned stacked body (S05), and aging the stacked body (S06).

First, preliminary preparation includes preparing the substrate in which a light blocking member is formed, preparing a photosensitive resin for forming the first layer, and preparing a photosensitive resin for forming the second layer.

In the preparing of the substrate in which the light blocking member is formed, light blocking members are disposed on the substrate formed of glass, plastic, or the like, and are spaced apart from each other at a predetermined distance therebetween. The light blocking member is formed of materials including metal particles of chromium (Cr), silver (Ag), molybdenum (Mo), nickel (Ni), titanium (Ti), tantalum (Ta), or the like, oxides of the metal particles, or combinations thereof. Separate spaces formed by the light blocking members serve as a first region to a third region.

In the preparing of the photosensitive resin for forming the first layer, a quantum dot-binder dispersed solution is prepared by mixing a binder and a chloroform dispersed solution of quantum dots (red or green) including a hydrophobic organic ligand at surfaces thereof. Herein, the quantum dots are uniformly dispersed in the quantum dot-binder dispersed solution.

Then, the photosensitive resin for forming the first layer is manufactured by mixing the prepared quantum dot-binder dispersed solution, a photopolymerization monomer, a photoinitiator, a light diffusing agent, a solvent, additives, and the like.

The photosensitive resin for forming the second layer is manufactured by mixing a photopolymerization monomer, a photoinitiator, a sensitizer, a light diffusing agent, a solvent, additives, and the like.

In step S01, the forming of the first layer, the photosensitive resin for forming the first layer is spin-coated onto the substrate on which the light blocking member is formed. An amount of the region filled with the photosensitive resin for forming the first layer may vary depending on the operation of the display device, and the first region to the third region may be partially filled therewith.

In step S02, the forming of the second layer, the photosensitive resin for forming the second layer is spin-coated on the first layer. Accordingly, a stacked body including a double layer on the substrate, in which the first layer and the second layer are sequentially stacked, may be obtained.

In the pre-baking (S03), moisture existing in the first layer and the second layer is removed by pre-baking (PRB) the obtained stacked body. Specific conditions of the pre-baking such as temperature, time, atmosphere, and the like are already known and may be appropriately adjusted. In some cases, the pre-baking may be omitted. Through the pre-baking, a dispersed state of the quantum dots and the light diffusing agent in the stacked body from which the moisture is removed may be changed.

In the exposing and developing (S04), the stacked body after being completely pre-baked is exposed to light having a predetermined wavelength using a mask including a predetermined pattern. The wavelength and intensity of the employed light may be adjusted in consideration of type and content of the photoinitiator and the quantum dots. Then, the exposed portions of the stacked body are developed using an organic solvent, an alkali solution, or the like. Following complete exposure and development of the exposed portions of the stacked body, the unexposed portion of the stacked body is dissolved, and the patterned stacked body in which the first layer and the second layer are stacked in a desired region may be obtained.

However, the luminous efficiency of the first layer is slightly deteriorated in comparison with the luminous efficiency of the first layer prior to the exposure and development, because a dispersed state of the quantum dots or the light diffusing agent in the first layer may be altered during the exposure and development, or alternatively, loss of the quantum dots or the light diffusing agent may occur during the exposure and development process.

In the post-baking (S05), the patterned stacked body may be post-baked (FOB) to improve crack resistance and solvent resistance. The post-baking may be conducted at a temperature of, e.g., about 150° C. to about 230° C. for a predetermined time, e.g., about 10 min or more, or about 20 min or more. As the post-baking is performed, physical and chemical characteristics of the first layer may be improved. However, the loss of the quantum dots and the light diffusing agent in the first layer may occur since heat is continuously applied thereto, so the luminous efficiency of the first layer may be slightly deteriorated.

In the aging (S06), the stacked body after being post-baked is continuously exposed to light having a weak intensity and a predetermined wavelength in order to stabilize an optical property of the stacked body. The specific conditions of the aging such as wavelength, intensity, exposure time, and the like may be appropriately adjusted. In some cases, the aging step may be omitted. The aging serves to improve the optical property of the stacked body, so the luminous efficiency of the first layer is slightly improved by the aging.

When the steps of S01 (the forming of the first layer) to S06 (the aging) are referred to as a unit process, the unit process may be repeatedly performed until all of the first region to the third region are filled by using a step which determines whether all of the first region to the third region of the aforementioned color filter are filled or not (S07). If all of the first region to the third region have been filled, the unit processes have been completed. If not all of the first region to the third region have been filled, the unit process is repeated.

However, in the present exemplary embodiment, a number of repeats of the unit process may vary depending on the kinds of the color filter and the operation of the display device. For example, in the case that the color filter 100 illustrated in FIG. 2 is manufactured, since the first region PX1 thereof is filled with the transparent body, one of the second region PX2 and the third region PX3 may be formed, and then the other region may be formed by repeating the unit process a single time.

The color filter manufactured by the above-described steps may minimize the luminous efficiency deterioration during the processes. This is because all of the processes are performed after forming the second layer 20, which serves as a passivation layer on the first layer 10 that serves as a light emitting layer, thereby physically and chemically protecting the first layer 10 from heat during the pre-baking or the post-baking steps, and from the solvent in the exposing and developing steps, or the like.

Hereinafter, specific examples of the described technology will be disclosed. However, the following examples are merely to exemplarily describe the described technology, so the range of the described technology is not limited thereto.

EXAMPLES

Example 1

[1] Preparing Quantum Dot-Binder Dispersed Solution

A quantum dot-binder dispersed solution is prepared by mixing chloroform in a dispersed solution including about 50 grams (g) of green quantum dots including oleic acid as a hydrophobic organic ligand at surfaces thereof, and about 100 g of a solution of a binder (propylene glycol monomethyl ether acetate, PGMEA at a concentration of about 30 weight percent (wt %)).

[2] Preparing Photosensitive Composition for Forming First Layer

A photosensitive composition for forming a first layer is prepared by mixing the quantum dot-binder dispersed solution prepared in step [1], about 100 g of hexaacrylate as a photopolymerization monomer, about 1 g of an oxime ester compound as a photoinitiator, about 30 g of $TiO_2$ as a light diffusing agent, about 10 g of pentaerythritol tetra(3-mercaptopropionate) as a curing agent, and about 300 g of PGMEA as a solvent.

[3] Preparing Photosensitive Composition for Forming Second Layer

The photosensitive composition for forming a second layer is prepared by mixing about 100 g of hexaacrylate as a photopolymerization monomer, about 1 g of an oxime ester compound as a photoinitiator, about 10 g of pentaerythritol tetra(3-mercaptopropionate) as a curing agent, and about 300 g of PGMEA as a solvent.

[4] Manufacturing Color Filter

The photosensitive composition for forming the first layer prepared in step [2] is spin-coated on a glass substrate, and then the photosensitive composition for forming the second layer prepared in step [3] is spin-coated on the first layer. Accordingly, a stacked film is obtained, in which the substrate, the first layer, and the second layer are sequentially stacked. The obtained stacked film is pre-baked at about 100° C. The pre-baked stacked film is exposed to light (wavelength: about 365 nm and intensity: about 100 mW) for about 1 second (s), using a mask having a predetermined pattern, and then is developed using a potassium hydroxide aqueous solution (concentration: about 0.043%) for about 50 s to obtain a pattern thereon. The stacked film on which the pattern is formed is post-baked three times, i.e., first, second, and third post-baking, at about 180° C. at about 30 min time intervals. The stacked film after the third post-baking is aged by exposing it to light (wavelength: about 450 nm, intensity: about 10 miliwatts (mW)) for 24 hours (h). At a time point at which each step is completed, a blue light conversion rate and a blue light absorption rate of the stacked film are measured, and the measured results are listed in Table 1.

In this example, the blue light conversion rate designates an amount of light converted to green light with respect to the amount of light radiated to a stack, and the blue light absorption rate designates an amount of light remaining at the first layer or the second layer without returning toward a light source with respect to the amount of light radiated to the stacked body. The blue light conversion rate and the blue light absorption rate are represented by an amount of light measured by a photometer (manufactured by Minolta Inc.) for a period of about 1 min.

Example 2

By executing identical steps [1] to [3] of Example 1, a photosensitive composition for forming a first layer and a photosensitive composition for forming a second layer are formed, and then the photosensitive composition for forming the first layer manufactured in the same manner as described in step [2] of Example 1 is spin-coated on a glass substrate, and the photosensitive composition for forming the second layer manufactured as described in step [3] of Example 1 is spin-coated on the first layer. Accordingly, a stacked film is obtained, in which the substrate, the first layer, and the second layer are sequentially stacked. The obtained stacked film is pre-baked at about 100° C. The pre-baked stacked film is exposed to light (wavelength: about 365 nm and intensity: about 100 mW) for about 1 s using a mask having a predetermined pattern, and then is developed using a potassium hydroxide aqueous solution (concentration: about 0.043%) for about 50 s to obtain a pattern thereon. Then, omitting the post-baking step, the stacked film on which the pattern is formed is directly aged by exposing it to light (wavelength: about 450 nm, intensity: about 10 mW) for 24 h. After each of the above steps is completed, the blue light conversion rate and the blue light absorption rate of the film are measured, and the measured results are listed in Table 2.

Comparative Example

By executing identical steps as described in steps [1] and [2] of Example 1, a photosensitive composition for forming a first layer is prepared, and then the photosensitive composition for forming the first layer prepared as described in step [2] of Example 1 is spin-coated on a glass substrate. Accordingly, a monolayer film is obtained, in which the first layer as a monolayer is stacked on the substrate. The obtained monolayer film is pre-baked, patterned (i.e. exposed and developed), and first, second, and third post-baked under identical conditions to those described in Example 1. Then, the blue light conversion rate and the blue light absorption rate of the monolayer film are measured after each step is completed, and the measured results are listed in Table 1.

Table 1 is as follows.

TABLE 1

|  |  | Example 1 | Comparative Example |
|---|---|---|---|
| Pre-baking (PRB) | Blue light conversion rate (%) | 30 | 29 |
|  | Blue light absorption rate (%) | 82 | 74 |
| Exposure and development | Blue light conversion rate (%) | 28 | 26 |

TABLE 1-continued

|  |  | Example 1 | Comparative Example |
|---|---|---|---|
| (EXP & DEV) | Blue light absorption rate (%) | 81 | 74 |
| First post-baking (POB1) | Blue light conversion rate (%) | 24 | 19 |
|  | Blue light absorption rate (%) | 82 | 75 |
| Second post-baking (POB2) | Blue light conversion rate (%) | 21 | 17 |
|  | Blue light absorption rate (%) | 83 | 75 |
| Third post-baking POB3 | Blue light conversion rate (%) | 22 | 15 |
|  | Blue light absorption rate (%) | 83 | 76 |
| Aging (AGN) | Blue light conversion rate (%) | 26 | ND |
|  | Blue light absorption rate (%) | 82 |  |
| POB1/PRB |  | 80 | 65 |
| POB2/PRB |  | 70 | 58 |
| POB3/PRB |  | 73 | 51 |
| AGN/PRB |  | 86 | ND |

In Table 1, in the case of the monolayer film of the Comparative Example, an additional process such as further forming a passivation layer or the like is needed to perform the aging step, so the aging is not performed in the comparative example. Accordingly, items related to the aging in the comparative example are listed as ND ("No Data").

Further, in Table 1, the post-baking step in which a light conversion rate is most severely deteriorated, is performed continuously three times instead of repeatedly performing the pre-baking, the exposing and developing, the post-baking, and the aging. As such, it is possible to simulate a thermal environment that may be applied to a filter firstly formed on the substrate when a filter is formed in each of the first region to the third region.

Referring to Table 1, in the case of the pre-baking as an initial step, blue light conversion rates are the same in Example 1 and the Comparative Example, but the blue light absorption rate of Example 1 are about an 8% higher value than that of the Comparative Example. This means that, in the case of the Comparative Example, the luminous efficiency is deteriorated by evaporating the moisture or the like in the first layer, which is the monolayer, in the pre-baking step.

The blue light conversion rates of Example 1 and the Comparative Example are deteriorated by a chemical environment where the exposure and the development are performed, but the blue light conversion rate of Example 1 shows slower deterioration than that of the Comparative Example.

The blue light conversion rate of the Comparative Example is gradually decreased by about 7%, about 2%, and about 1% in the first to third post-baking steps, respectively. In total, the Comparative Example generally shows a total luminous efficiency deterioration of about 10%. In contrast, the blue light conversion rate of Example 1 is decreased by about 4% in the first post-baking step and about 3% in the second post-baking step, but is increased by about 1% in the third post-baking step. In total, Example 1 generally shows a total luminous efficiency deterioration of about 6%.

Based on the results of Table 1, when the light conversion rate of the stacked body being post-baked with respect to that of the stacked body being pre-baked is referred to as first retention, it can be seen that the first retention of Example 1 may be in a range of about 70% to about 100%.

In contrast, in the case of being formed as the monolayer in the Comparative Example, it can be seen that the first retention may be a maximum of about 65% or less. Therefore, it can be seen that the stacked structure of Example 1, in which the second layer is further disposed on the first layer, may effectively prevent the luminous efficiency deterioration caused by heat.

Meanwhile, in the case of Example 1, an optical characteristic of the first layer may be improved by the aging. Accordingly, it can be seen that the luminous efficiency after the aging step is increased by about 4% in comparison with that after the third post-baking step. Further, when the light conversion rate of the aged stacked body with respect to that of the pre-baked stacked body is referred to as second retention, it can be seen that the second retention of Example 1 may be in a range of about 85% to about 100%.

In contrast, in the case of being formed as the monolayer in the Comparative Example, the additional step for forming the passivation layer or the like after the post-baking step is required to perform the aging, and a total number of steps is increased, which may be undesirable in consideration of manufacturing efficiency.

Table 2 is as follows.

TABLE 2

|  |  | Example 2 |
| --- | --- | --- |
| Pre-baking (PRB) | Blue light conversion rate (%) | 31 |
|  | Blue light absorption rate (%) | 78 |
| Exposure and development (EXP & DEV) | Blue light conversion rate (%) | 31 |
|  | Blue light absorption rate (%) | 78 |
| Aging (AGN) | Blue light conversion rate (%) | 36 |
|  | Blue light absorption rate (%) | 78 |
| AGN/PRB |  | 86 |

Referring to Table 2, for Example 2, in which the stacked body is subjected to the aging step after the patterning step without being subjected to the post-baking step, an excellent blue light conversion rate is shown.

For example, when the light conversion rate of the aged stacked body with respect to that of the post-baked stacked body is referred to as third retention, the third retention may be in a range of about 100% to about 120%.

Therefore, it can be seen that the luminous efficiency of Example 2 may be improved similarly to that of Example 1 even though the aging step is directly performed without the post-baking step.

As described above, the luminous efficiency deterioration during the manufacturing process may be minimized when the color filter according to the exemplary embodiment is manufactured by performing the photolithographic patterning process after forming the stacked body including the second layer which serves as the optical barrier layer disposed on the first layer which serves as the light emitting layer. Moreover, the display device including the color filter as well as the color filter may be expected to show an improvement in luminous efficiency of the first layer due to the light-recycling caused by the second layer.

Consequently, according to the exemplary embodiment, it is possible to provide a color filter and a display device including the color filter that may minimize the luminous efficiency deterioration which occurs during the manufacturing process and maintain the excellent luminous efficiency after the manufacturing process.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A color filter comprising:
   a first region configured to emit a first light;
   a second region configured to emit a second light having a longer wavelength than a wavelength of the first light;
   a third region configured to emit a third light having a longer wavelength than the wavelength of the second light;
   a first layer comprising about two or more quantum dots; and
   a second layer disposed on at least one surface of the first layer,
   wherein the first region, the second region, and the third region are spaced apart from each other by a predetermined distance,
   wherein the first layer is disposed to correspond to at least one of the second region and the third region, and the second layer is disposed to correspond to at least one of the second region and the third region, except for the first region, and
   wherein the second layer has light transmittance of greater than or equal to about 80 percent with respect to the first light.

2. The color filter of claim 1, wherein the first light is blue light.

3. The color filter of claim 1, wherein a thickness of the second layer is in a range of about 10 percent to about 60 percent of a thickness of the first layer.

4. The color filter of claim 1, wherein each of the first layer and the second layer comprises of a photosensitive resin.

5. The color filter of claim 1, wherein the first layer further comprises a light diffusing agent selected from a metal oxide particle, a metal particle, and a combination thereof.

6. The color filter of claim 1, wherein the quantum dots comprise a Group II-VI compound, a Group III-V compound, a Group IV-VI compound, a Group IV compound, a Group compound, a Group I-II-IV-VI compound, or a combination thereof.

7. The color filter of claim 1, wherein the quantum dots comprise:
   a plurality of first quantum dots disposed in the second region and configured to emit the second light having a longer wavelength than the wavelength of the first light by absorbing the first light; and
   a plurality of second quantum dots disposed in the third region and configured to emit the third light having a longer wavelength than the wavelength of the first light and the wavelength of the second light by absorbing the first light.

8. The color filter of claim 1, wherein the first region comprises a transparent body.

9. The color filter of claim 1, wherein the color filter receives the first light from a light source in a first direction, and wherein in the color filter the first layer is disposed in front of the second layer in the first direction.

10. A method of manufacturing a color filter, the method comprising:
forming a first layer on a substrate, wherein the first layer comprises about two or more quantum dots;
forming a second layer on the first layer to obtain a stacked body in which the first layer and the second layer are disposed on the substrate;
pre-baking the stacked body;
patterning the stacked body to obtain a patterned stacked body; and
post-baking the patterned stacked body,
wherein the color filter comprises:
a first region configured to emit a first light;
a second region configured to emit a second light having a longer wavelength than a wavelength of the first light;
a third region configured to emit a third light having a longer wavelength than the wavelength of the second light; and
wherein the first layer is disposed to correspond to at least one of the second region and the third region, and
wherein the second layer has light transmittance of greater than or equal to about 80 percent with respect to the first light.

11. The method of claim 10, wherein the pre-baked stacked body has a first retention of about 70% to about 100%, wherein the first retention is a percentage of a light conversion rate of the post-baked stacked body with respect to a light conversion rate of the pre-baked stacked body.

12. The method of claim 10 further comprising aging the stacked body.

13. The method of claim 12, wherein the aged stacked body has a second retention of about 85% to about 100%, wherein the second retention is a percentage of a light conversion rate of the aged stacked body with respect to a light conversion rate of the pre-baked stacked body.

14. The method of claim 12, wherein the aged stacked body has a third retention of about 100% to about 120%, wherein the third retention is a percentage of the light conversion rate of the aged stacked body with respect to light conversion rate of the post-baked stacked body.

15. A display device comprising:
a color filter comprising:
a first region configured to emit a first light;
a second region configured to emit a second light having a longer wavelength than a wavelength of the first light;
a third region configured to emit a third light having a longer wavelength than the wavelength of the second light;
a first layer comprising about two or more quantum dots; and
a second layer disposed on at least one surface of the first layer,
wherein the first region, the second region, and the third region are spaced apart from each other by a predetermined distance, and
wherein the first layer is disposed to correspond to at least one of the second region and the third region, and wherein the second layer has light transmittance of greater than or equal to about 80 percent with respect to the first light;
a light source configured to emit the first light in a first direction;
a first substrate disposed in front of the light source in the first direction;
the color filter disposed in front of the first substrate in the first direction; and
a second substrate disposed in front of the color filter in the first direction,
wherein in the color filter the first layer is disposed in front of the second layer in the first direction.

16. The display device of claim 15 further comprising a liquid crystal layer interposed between the first substrate and the color filter or between the color filter and the second substrate.

* * * * *